US006949803B2

(12) United States Patent
Zuliani et al.

(10) Patent No.: US 6,949,803 B2
(45) Date of Patent: Sep. 27, 2005

(54) MANUFACTURING PROCESS FOR A HIGH VOLTAGE TRANSISTOR INTEGRATED ON A SEMICONDUCTOR SUBSTRATE WITH NON-VOLATILE MEMORY CELLS AND CORRESPONDING TRANSISTOR

(75) Inventors: Paola Zuliani, Milan (IT); Katia Giarda, Novara (IT); Roberto Annunziata, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 57 days.

(21) Appl. No.: 10/675,245

(22) Filed: Sep. 29, 2003

(65) Prior Publication Data

US 2004/0137668 A1 Jul. 15, 2004

(30) Foreign Application Priority Data

Sep. 30, 2002 (EP) .......................................... 02425592

(51) Int. Cl.[7] ........................ H01L 21/336; H01L 29/78

(52) U.S. Cl. ........................................ 257/409; 438/197

(58) Field of Search ................................ 438/197, 201, 438/211, 229–232, 257, 266, 301, 303, 305–307; 257/288, 314–316, 368, 409

(56) References Cited

U.S. PATENT DOCUMENTS 5,017,985 A * 5/1991 Lin ............................ 257/356
5,449,637 A * 9/1995 Saito et al. ................. 438/227
5,622,886 A 4/1997 Allum et al. ............... 438/238
6,159,795 A 12/2000 Higashitani et al. ........ 438/257
6,190,983 B1 * 2/2001 Tsai ........................... 438/307
6,268,633 B1 * 7/2001 Pio et al. .................... 257/391
6,278,163 B1 * 8/2001 Pio et al. .................... 257/408
6,448,593 B1 9/2002 Higashitani et al. ........ 257/288
6,822,289 B2 * 11/2004 Kozuka et al. ............. 257/335
2001/0019157 A1 * 9/2001 Pio et al. .................... 257/368

FOREIGN PATENT DOCUMENTS

JP 9-283643 10/1997
WO WO 00/31793 6/2000

* cited by examiner

*Primary Examiner*—Evan Pert
(74) *Attorney, Agent, or Firm*—Lisa K. Jorgenson; Robert Iannucci; Seed IP Law Group PLLC

(57) ABSTRACT

A process for fabricating high-voltage drain-extension transistors, whereby the transistors are integrated in a semiconductor substrate along with non-volatile memory cells that include floating gate transistors. The process includes: defining respective active areas for HV transistors and floating gate transistors in a semiconductor substrate, with the active areas separated from each other by insulating regions; forming insulated gate regions of the HV transistors; performing a first dopant implantation to form first portions of the HV transistor junctions; conformably depositing a dielectric layer onto the whole substrate to provide an interpoly layer of the floating gate transistor; making openings at the first portions of the HV transistor junctions; performing, through the openings, a second dopant implantation to form second portions of the high-voltage transistor junctions, with perimeter areas of the gate regions and the active area of the floating gate transistor being screened off by the dielectric layer.

18 Claims, 4 Drawing Sheets

MANUFACTURING PROCESS FOR A HIGH VOLTAGE TRANSISTOR INTEGRATED ON A SEMICONDUCTOR SUBSTRATE WITH NON-VOLATILE MEMORY CELLS AND CORRESPONDING TRANSISTOR

BACKGROUND OF THE INVENTION

1. Field of the Invention

The present invention relates to a process for fabricating a high-voltage transistor integrated in a semiconductor substrate in association with non-volatile memory cells.

Although not limited to, the invention relates to a process for fabricating a high-voltage transistor, being integrated in a semiconductor substrate along with a non-volatile memory cell, and the following description will cover this field of application for convenience of illustration only.

2. Description of the Related Art

As it is well known in this technical field, a more frequent market trend regards the demand of low-consumption and high-density logic circuits to be integrated as well as non-volatile memories, within a common semiconductor electronic device. This necessity greatly complicates the process of fabricating such integrated electronic devices because, as explained hereinafter, these circuit types are fabricated with technologies that are not fully compatible with each other. This reflects on increased manufacturing costs as well as increased difficulty to achieve high performance levels.

For example, fabricating suitable HV (High-Voltage) transistors to handle high voltages (>12V) used in programming non-volatile memory cells is a complicated process-that is not compatible with the concurrent presence of low-voltage logic circuits (microcontrollers, SRAMs, ROMs).

Another matter of concern is the speed rate of transmission of electric signals normally expected to be reached by such devices. On this account, the transistors incorporated in such devices are conventionally subjected to a silicidation treatment. This treatment basically consists of metallizing the junctions and gate regions of logic circuit transistors with silicide, and has a drawback in that it reduces the breakdown performance of the junctions.

This runs counter to the necessity to form HV transistors, which have a characterizing feature in their high resistance to breakdown.

A first prior approach to raising the value of a transistor breakdown voltage has consisted of changing the dopant levels of the source and drain junctions.

In particular HV transistors, whose breakdown voltage is provided sufficiently high to handle high bias and operating voltages, have had their source and drain junctions formed from lightly doped regions.

Although advantageous under many points of view, this prior approach has a number of drawbacks. In particular, a compromise between an admissible breakdown voltage and the active characteristics of the transistor as regards current delivery must be reached. The high serial resistance that a lightly doped junction is bound to introduce adds to the difficulty of finding an effective working point between the breakdown voltage and the transistor saturation current.

Another problem of high-voltage transistors is the high intensity of the electric fields established between the borderline of the active area and the field oxide of the transistor.

BRIEF SUMMARY OF THE INVENTION

An embodiment of this invention provides a process for fabricating a high-voltage transistor, which has structural features such to prevent the occurrence of high electric fields in the silicon, specifically at the borderline area between the field oxide and the active area of the transistor where the source and drain junctions are located, thereby overcoming the drawbacks of prior processes to integrate electronic devices with different electrical requirements in a common substrate.

The embodiment provides a process for fabricating a memory cell and a high-voltage transistor that includes a dual source/drain junction, which process has steps in common with the process used for fabricating non-volatile memory cells.

An embodiment of the invention provides a process for fabricating high-voltage (HV) drain-extension transistors integrated on a semiconductor substrate along with non-volatile memory cells that include floating gate transistors. The process includes:

- defining respective active areas for HV transistors and floating gate transistors in a common semiconductor substrate, with the active areas being separated from each other by insulating regions;
- depositing a layer of gate oxide onto the active areas;
- depositing a layer of polysilicon onto the gate oxide layer;
- first masking and then etching through the polysilicon layer to form gate regions of the HV transistors;
- performing a first dopant implantation to form first junction portions of the high-voltage transistors;
- conformably depositing a dielectric layer onto the whole substrate to provide an interpoly layer of the floating gate transistor;
- forming openings at the first junction portions of the HV transistors;
- performing, through the openings, a second dopant implantation to form second junction portions of the HV transistors, with perimeter areas of the gate regions and the active areas of the floating gate transistors being screened off by the dielectric layer.

Another embodiment of the invention provides a high-voltage transistor integrated in a semiconductor substrate with a first type of conductivity. The transistor includes a gate region between corresponding drain and source junctions. The junctions comprise lightly doped first regions with a second type of conductivity and more heavily doped second regions with the second type of conductivity that lie within the first regions. The drain and source junctions are covered by a thin dielectric layer only at the locations of the first regions.

The features and advantages of the process according to the invention should become understood from the following description of an embodiment thereof, given by way of non-limitative example with reference to the accompanying drawings.

DETAILED DESCRIPTION OF THE INVENTION

Figure 1:
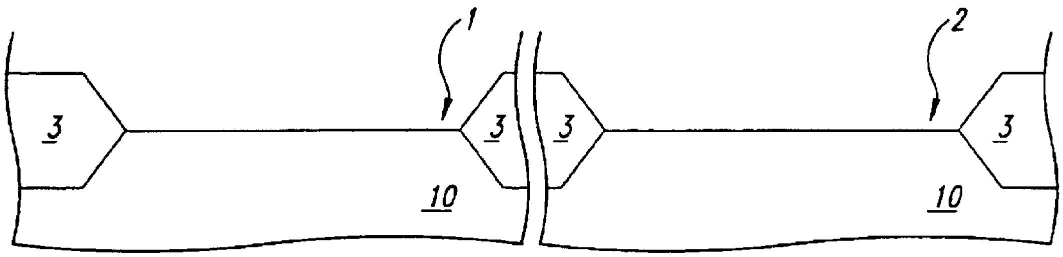
FIGS. 1 to 4 show an enlarged cross-sectional schematic view of a portion of a semiconductor integrated circuit, comprising a non-volatile memory cell and a high-voltage transistor, during the several steps of its fabricating process.

The process steps and the structures described herein below do not purport to be exhaustive of a process flow for fabricating integrated circuits.

This invention can be practiced in combination with IC fabrication techniques currently in use, and only such conventional process steps which are necessary to an understanding of this invention will be described.

Drawings that show cross-sections through portions of an integrated circuit at different stages of its fabrication process are not true to scale, being rather directed to highlight major features of an embodiment of the invention.

A process for fabricating a high-voltage transistor in association with a non-volatile memory cell, according to this invention, will now be described with reference to the drawing views.

First, the active areas of the different transistors are defined on a semiconductor substrate 10 having a first conductivity type, such as a P-type conductivity.

As shown in FIG. 1 by way of example, an active area 1 for a memory cell comprising a floating gate transistor and an active area 2 for a HV transistor are defined.

These active areas are separated from each other, as well as from all the other devices in the semiconductor 10, by insulating field oxide regions 3.

Of course, every active area are realized for a predetermined type of transistors.

Figure 2:
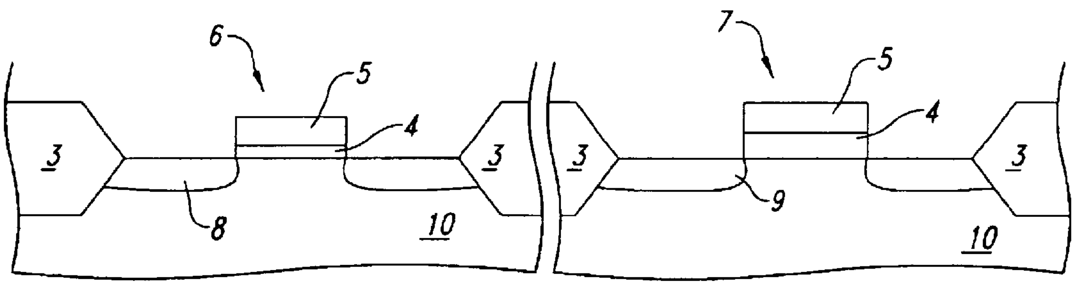
Figure 3:
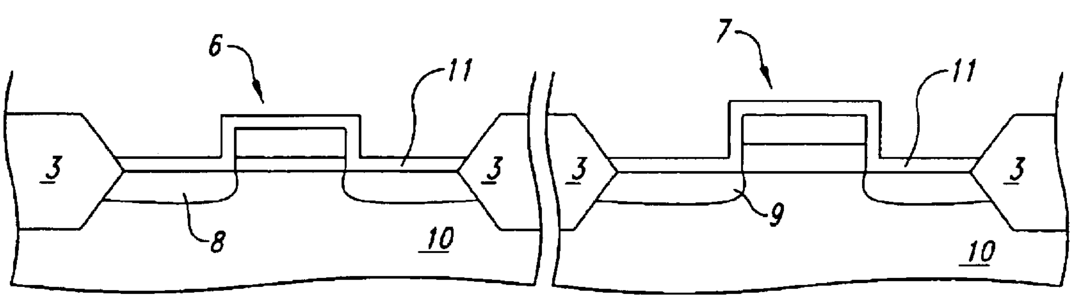
Figure 9:
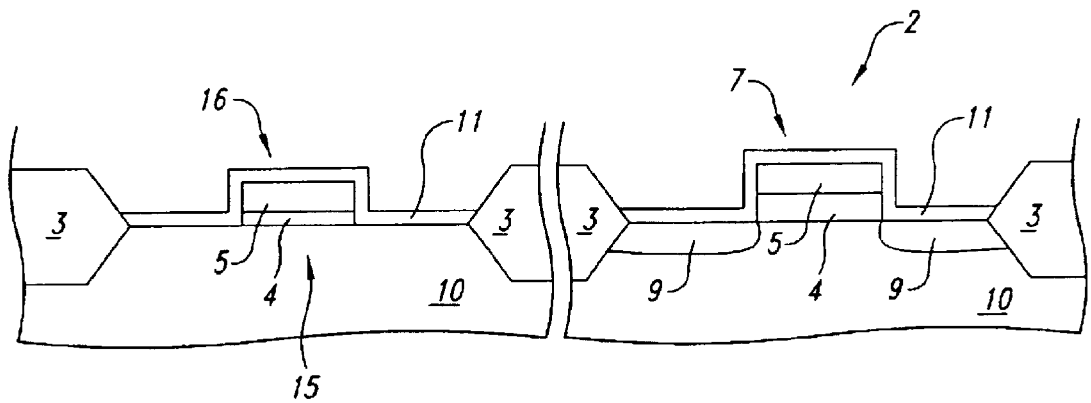
FIGS. 9 and 10 show an enlarged cross-sectional schematic view of a portion of the semiconductor integrated circuit, comprising the high-voltage transistor and a low voltage transistor, during several steps of its fabricating process.

A thin layer 4 of gate oxide is formed on top of the active areas 1 and 2. The thickness of the layer 4 may be greater over the active area 2 for the HV transistor compared to the layer 4 for the floating gate transistor, as shown in FIG. 2 for example, and compared to the layer 4 for a low voltage logic transistor, as shown in FIG. 9. Also, the portion of the layer 4 that overlies the active area 1 of the floating gate transistor may vary in thickness to suit the type of non-volatile memory cell to be fabricated.

The above is followed by a step of depositing a polysilicon layer 5, for forming the gate regions of both the HV and the floating gate transistors.

A first poly mask is used for defining and forming the gate region 7 of the high-voltage transistor and the floating gate region 6 of the floating gate transistor, where the process is arranged to include this step. The polysilicon layer 5 is etched away from either sides of the gate region, as shown in FIG. 2.

Light dopant is then implanted to form first portions 9 of the source and drain junctions of the high-voltage transistors.

Another dopant implanting step is carried out to form source and drain junctions 8 of the floating gate transistor, where the process is arranged to include this step.

The first light dopant implanting step is followed by a step of depositing a conformable dielectric layer 11 onto the entire semiconductor 10.

The dielectric layer 11 typically is formed by means of an ONO (Oxide-Nitride-Oxide) layer, although many other insulating materials could be employed in the dielectric layer 11.

This dielectric layer 11 is used, in a conventional process flow for fabricating non-volatile memory cells, to provide the interpoly dielectric layer of the non-volatile memory cell.

Advantageously, this dielectric layer 11 would be a thin layer that has been conformably deposited.

Figure 4:
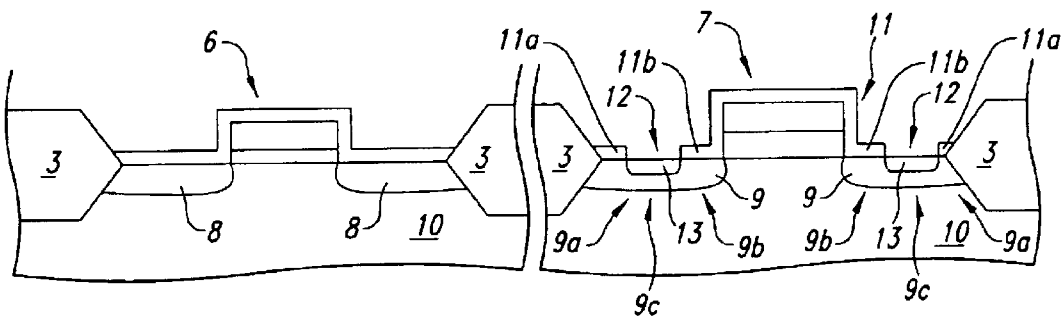

Openings 12 are made in the dielectric layer 11 and are aligned to the first portions 9 of the high-voltage transistor junctions, as shown in FIG. 4. The openings 12 are defined on opposite sides by first and second portions 11A, 11B of the dielectric layer 11. The first and second portions 11A, 11B of the dielectric layer 11 are respectively positioned directly above first and second perimeter portions 9A, 9B, respectively, of the first junction portions 9. The first and second perimeter portions 9A, 9B are at opposite sides of central portions 9C of the first-junction portions 9, such that the first perimeter portions 9A are adjacent to the thick oxide layers 3, the second perimeter portions 9B are adjacent to the gate regions 7 of the HV transistors, and the central portions 9C are located immediately below the openings 12.

A heavy dopant implantation is then applied through the openings 12, in order to form second junction portions 13 of the high-voltage transistor in the central portions 9C of the first junction portions 9.

Figure 8:
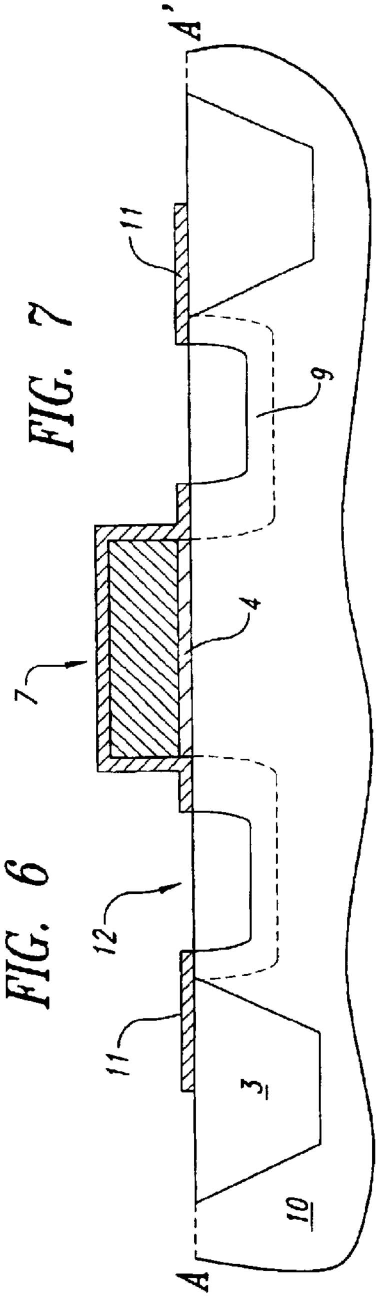
FIG. 8 shows a schematic enlarged cross-sectional view of the high-voltage transistor of this invention.

Advantageously, the second junction portions 13 of the high-voltage transistor are entirely included within the first junction portions 9 of the high-voltage transistor, as shown in detail in FIGS. 4 and 8. This embodiment allows a high-voltage transistor to be formed having a high breakdown voltage, yet prevents strong electric fields from occurring in the semiconductor substrate at the borderline between the field oxide and the active area of the transistor.

Figure 5:
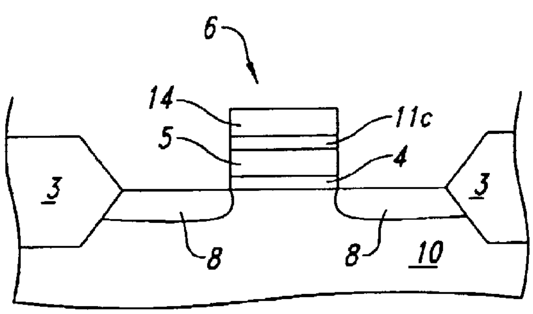
FIG. 5 shows an enlarged cross-sectional schematic view of the non-volatile memory cell.

Shown in FIG. 5 is the floating gate transistor after the thin dielectric layer has been etched to form an inter-poly dielectric layer 11C and after a second polysilicon layer has been deposited and etched to form a control gate 14 according to know processes.

Figure 7:
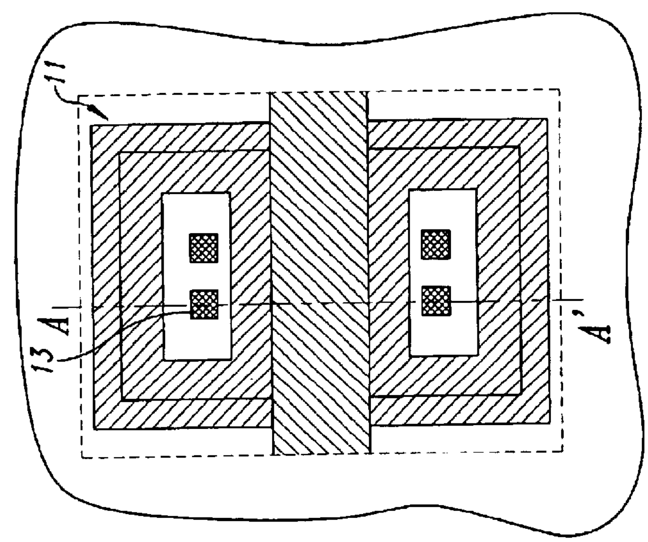
FIGS. 6 and 7 show schematic top view of the high-voltage transistor portion of the circuit shown in FIGS. 2 and 4, respectively.
Figure 6:
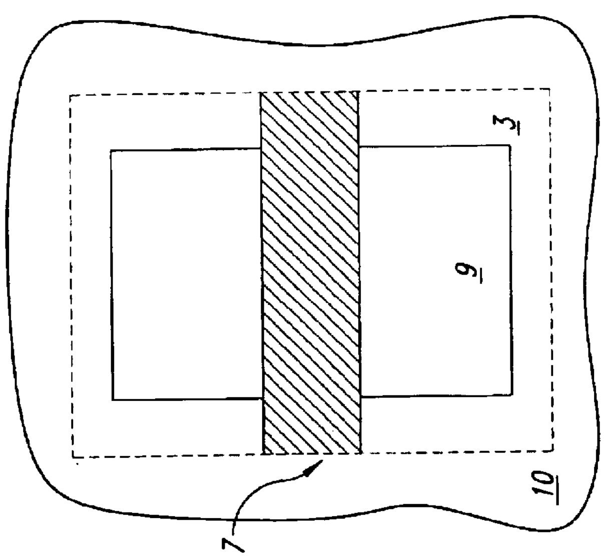

FIGS. 6 and 7 show schematic top view of the high-voltage transistor portion of the circuit shown in FIGS. 2 and 4, respectively. FIG. 8 is an enlarged cross-sectional view of the high-voltage transistor taken along line A–A' of FIG. 7.

Figure 10:
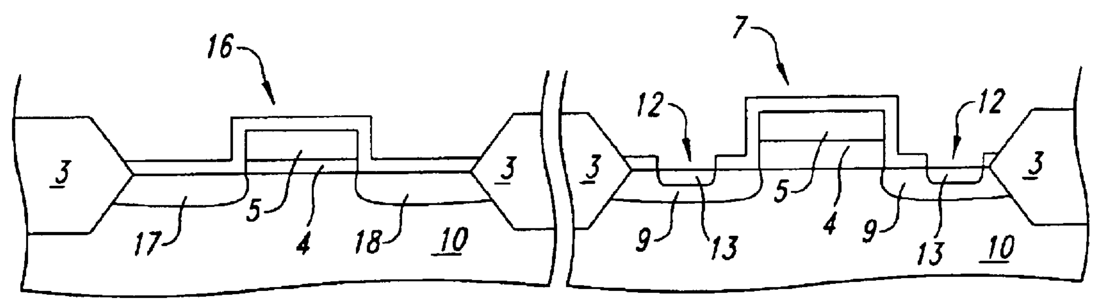

FIGS. 9 and 10 show an enlarged cross-sectional schematic view of a portion of the semiconductor integrated circuit, comprising the high voltage transistor and a low voltage transistor. The low voltage transistor is formed using many of the same steps previously described with respect to the fabrication of the high voltage and floating gate transistors. In particular, an active area 15 for the low voltage transistor is formed in the substrate 10 and between respective field oxide regions 3 when forming the active areas 1, 2 of the floating gate and high voltage transistors, respectively. In addition, the gate oxide layer 4 and the polysilicon layer 5 are deposited an etched to form a gate region 16 of the low voltage transistor when forming the gate regions 6, 7 of the floating gate and HV transistors, respectively. Moreover, the dielectric layer 11 is also deposited on the active region, 15 of the low voltage transistor, as shown in FIG. 9.

Advantageously, the dielectric layer 11 is selectively removed in order to make the openings 12 using a pattern on a mask, known as the matrix mask, employed in the conventional fabrication process of non-volatile memory cells. In particular, the same mask is used as in removing the dielectric layer 11 from those portions of the substrate 10 where low-voltage devices, such as the low voltage transistor, are to be formed. That is, the dielectric layer 11 is removed from above the active region 15 of the low voltage transistor simultaneously with the formation of the openings 12, as shown in FIG. 10.

Advantageously, the process allows the same heavy implantation to be used for forming the junctions of both the low- and the high-voltage transistors. That is, the second dopant implantation used to form the second junction portions 13 of the high voltage transistor is also used to form source and drain regions 17, 18 of the low voltage transistor. As the size of the single devices decreases, the low voltage transistor junctions are formed with surface junctions. Briefly, the process of the invention meets the requirements for simultaneously fabricate high-and low-voltage devices associated with non-volatile memory cells.

Furthermore, by calibrating the distances of the openings 12 from the gate region of the high-voltage transistor, and from the perimeter of the active region, the second portions 13 can be located within the first portions 9, thereby achieving the intended transistor performance.

The process phases then include a conventional step of siliciding the junctions not covered by dielectric layers.

The process is completed with conventional steps, not illustrated, aimed at providing a finished memory device.

The process allows drain-extension HV transistors to be integrated along with non-volatile memory cells by a simple modification to the interpoly layer patterning step in a process flow for fabricating non-volatile memory cells.

In addition, the inventive process has the advantage of allowing the fabrication of drain-extension HV transistors to include a step of siliciding the junctions of high-voltage transistors in a consistent manner with advanced logics. The process, moreover, involves no additional contact implantations.

It should be further noted that the dopant profile of the gate regions of the high-voltage transistors can be set, in the process of the invention, so that the junction breakdown in the high-voltage transistor is adequately high.

To summarize, the process allows high-voltage transistors to be produced which have-first portions 9 of the source and drain junctions that are lightly doped formed close to the gate regions and the field oxide layers, and second portions 13 of the source and drain junctions that are more heavily doped locally in order to be compatible with a silicide layer (TiSi2/CoSi2) being formed at no risk of harming the junction by dopant depletion.

In particular, the dielectric layer 11 is used to screen the regions realized close to the gate region and the field oxide layer at the edge of the active area with respect to the heavy second implantation in the high-voltage device.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

This process has been described in connection with one possible process flow for fabricating non-volatile memory cells. However, from the process of this invention can also benefit processes for fabricating non-volatile memory cells of the self-aligned type. Specifically in such self-aligned processes, the etching step for the gate region of the floating gate transistor would be carried out after forming the high-voltage transistor according to the invention.

What is claimed is:

1. A process for fabricating high-voltage drain-extension transistors, whereby the transistors are integrated in a semiconductor substrate along with non-volatile memory cells that include floating gate transistors, said process comprising at least the following steps:

- defining respective active areas for HV transistors and floating gate transistors in a common semiconductor substrate, with said active areas being separated from each other by insulating regions;
- depositing a layer of gate oxide onto said active areas;
- depositing a layer of polysilicon onto the gate oxide layer;
- first masking and then etching through the polysilicon layer to form gate regions of said HV transistors;
- performing a first dopant implantation to form first junction portions of the HV transistors;
- conformably depositing a dielectric layer onto the whole substrate to provide an interpoly layer of said floating gate transistor;
- forming openings at the first junction portions of the HV transitors; and
- performing, through said openings, a second dopant implantation to form second junction portions of the HV transistors, with perimeter areas of the gate regions and the active areas of the floating gate transistors being screened off by said dielectric layer.

2. A process according to claim 1, wherein said second junction portions of the HV transistors are shallower than said first junction portions of the HV transistors.

3. A process according to claim 1, further comprising a step of siliciding said second junction portions of the HV transistors.

4. A high-voltage transistor integrated in a semiconductor substrate with a first type of conductivity, comprising a gate region comprised between corresponding drain and source junctions, wherein said junctions comprise first regions lightly doped with a second type of conductivity and heavily doped second regions with the second type of conductivity, wherein said more doped second regions lie centrally within said lightly doped first regions such that first and second portions of the first regions are positioned immediately adjacent to opposite sides of the second regions, the transistor further including a thin dielectric layer that covers said drain and source junctions only at locations of said first and second portions of said lightly doped first region.

5. The transistor of claim 4 wherein the thin dielectric layer extends on and completely across the gate region and on the first portions of the drain and source junctions, which are adjacent to the gate region.

6. A memory device integrated in a semiconductor substrate, comprising:

- a floating gate memory transistor having a gate positioned on the substrate and source and drain regions positioned in the substrate at opposite sides of a channel region positioned under the gate, the gate including a gate dielectric layer positioned on the channel region, a conductive floating gate region positioned on the gate dielectric layer, and an intermediate dielectric layer positioned on the floating gate region; and
- a high voltage transistor having a gate positioned on the substrate and source and drain regions positioned in the substrate at opposite sides of a channel region positioned under the gate of the high voltage transistor, wherein at least one of the source and drain regions includes a lightly doped first region that is overlaid by the intermediate dielectric layer and a highly doped second region positioned within the first region and below an opening in the intermediate dielectric layer.

7. The memory device of claim 6, wherein the second region is centrally located within the first region such that first and second portions of the first region are positioned immediately adjacent to opposite sides of the second region.

8. The memory device of claim 6 wherein the intermediate dielectric layer extends on and completely across the gate of the high voltage transistor and on the first portion of the first region, which is immediately adjacent to the channel region of the high voltage transistor.

9. A method of fabricating a memory device integrated in a semiconductor substrate, the memory device including a high voltage transistor, the method comprising:

forming a gate that includes a gate dielectric on the substrate and a conductive gate layer on the gate dielectric;

performing a first dopant implantation to form first junction regions on opposite sides of a channel region underlying the gate;

forming a dielectric layer on the gate and on the first junction regions;

forming an opening in the dielectric layer above a central portion of one of the first junction portions, the opening being defined by first and second portions of the dielectric layer that are on opposite sides of the opening and above the one of the first junction portions; and performing, through the opening, a second dopant implantation to form a second junction portion within the central portion, while the first and second portions of the dielectric area screen off peripheral portions of the one of the first junction portions.

10. The method claim 9, wherein the second junction portion is shallower than the first junction portions of the high voltage transistor.

11. The method claim 9, further comprising siliciding the second junction portion of the high voltage transistor.

12. The method of claim 9, wherein:

forming the gate includes forming a gate dielectric of a floating gate transistor integrated in the substrate and forming from the conductive gate layer a floating gate on the gate dielectric of the floating gate transistor;

performing the first dopant implantation includes forming junction regions on opposite sides of a channel region underlying the gate dielectric of the floating gate transistor;

the dielectric layer is formed on the floating gate to form an intermediate dielectric layer of the floating gate transistor; and the method further includes forming a control gate on the intermediate dielectric layer.

13. The method of claim 9 wherein forming the gate includes forming an insulated gate of a low voltage transistor, the dielectric layer is formed on the insulated gate and on portions of the substrate at which source and drain regions of the low voltage transistor will be formed, forming the opening includes removing the dielectric layer from the portions of the substrate at which the source and drain regions of the low voltage transistor will be formed, and performing the second dopant implantation includes forming the source and drain regions of the low voltage transistor.

14. A process for fabricating high-voltage drain-extension transistors, whereby the transistors are integrated in a semiconductor substrate along with non-volatile memory cells that include floating gate transistors, the process comprising at least the following steps:

defining respective active areas for HV transistors and floating gate transistors in a common semiconductor substrate, with the active areas being separated from each other by insulating regions;

forming insulated gate regions of the HV transistors;

performing a first dopant implantation to form first junction portions of the HV transistors;

conformably depositing a dielectric layer onto the whole substrate to provide an interpoly layer of the floating gate transistor;

forming openings at the first junction portions of the HV transistors; and performing, through the openings, a second dopant implantation to form second junction portions of the HV transistors, with perimeter areas of the gate regions and the active areas of the floating gate transistors being screened off by the dielectric layer.

15. A process according to claim 14, wherein the second junction portions of the HV transistors are shallower than the first junction portions of the HV transistors.

16. A process according to claim 14, further comprising a step of siliciding the second junction portions of the HV transistors.

17. A process according to claim 14, wherein the openings in the dielectric layer are above respective central portions of the first junction portions, each of the openings being defined by respective first and second portions of the dielectric layer that are on opposite sides of the opening and above the first junction portions; wherein the second junction portions are within the central portion and are completely surrounded by the first junction portions.

18. A process according to claim 14 wherein forming the insulated gate regions includes forming an insulated gate of a low voltage transistor, the dielectric layer is formed on the insulated gate and on portions of the substrate at which source and drain regions of the low voltage transistor will be formed, forming the openings includes removing the dielectric layer from the portions of the substrate at which the source and drain regions of the low voltage transistor will be formed, and performing the second dopant implantation includes forming the source and drain regions of the low voltage transistor.

* * * * *

UNITED STATES PATENT AND TRADEMARK OFFICE

CERTIFICATE OF CORRECTION

PATENT NO. : 6,949,803 B2
DATED : September 27, 2005
INVENTOR(S) : Paola Zuiliani et al.

It is certified that error appears in the above-identified patent and that said Letters Patent is hereby corrected as shown below:

<u>Column 6,</u>
Line 19, "transitors" should read -- transistors --.
Line 44, "region" should read -- regions --.

Signed and Sealed this

Twenty-fifth Day of April, 2006

JON W. DUDAS
*Director of the United States Patent and Trademark Office*